(12) United States Patent
Lee

(10) Patent No.: US 10,499,490 B2
(45) Date of Patent: Dec. 3, 2019

(54) HIGH SPEED DIFFERENTIAL TRACE WITH REDUCED RADIATION IN RETURN PATH

(71) Applicant: QUANTA COMPUTER INC., Taoyuan (TW)

(72) Inventor: Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/891,007

(22) Filed: Feb. 7, 2018

(65) Prior Publication Data

US 2019/0166685 A1    May 30, 2019

Related U.S. Application Data

(60) Provisional application No. 62/590,417, filed on Nov. 24, 2017.

(51) Int. Cl.
*H05K 1/02* (2006.01)
*H01P 3/02* (2006.01)
(Continued)

(52) U.S. Cl.
CPC ......... *H05K 1/0228* (2013.01); *H01L 21/563* (2013.01); *H01P 3/026* (2013.01);
(Continued)

(58) Field of Classification Search
CPC ............... H05K 1/0228; H05K 1/0245; H01R 13/6471; H01R 12/732; H01R 12/523; H01L 21/563
(Continued)

(56) References Cited

U.S. PATENT DOCUMENTS 8,253,509 B2 * 8/2012 Pai .................... H01P 1/20381
                                                                        333/12
9,786,331 B1   10/2017 Wallash
(Continued)

FOREIGN PATENT DOCUMENTS

JP          2004260420 A     9/2004

OTHER PUBLICATIONS

Extended European Search Report for EP Application No. 18169206.2, dated Nov. 16, 2018.
(Continued)

*Primary Examiner* — Sherman Ng
(74) *Attorney, Agent, or Firm* — Nixon Peabody LLP; Zhou Lu

(57) ABSTRACT

A high speed differential trace structure reducing common mode radiation is disclosed. The differential trace structure includes a first trace and a parallel second trace. A printed circuit board layer has a top surface and an opposite bottom surface. The traces are formed on the top surface. The structure includes a ground plane layer having a top layer in contact with the opposite bottom surface of the circuit board. A first void section is formed in the top layer of the ground plane layer to one side of the first trace. A second void section is formed in the top layer of the ground plane layer to one side of the second trace. The length of the second void section is determined based on a target radiation frequency. A third void section is formed in the ground plane layer that joins the first void section and the second void section.

10 Claims, 9 Drawing Sheets

(51) Int. Cl.
  *H01L 21/56* (2006.01)
  *H01R 12/52* (2011.01)
  *H01R 12/73* (2011.01)
  *H01R 13/6471* (2011.01)

(52) U.S. Cl.
  CPC ......... *H01R 12/523* (2013.01); *H01R 12/732* (2013.01); *H01R 13/6471* (2013.01); *H05K 1/0224* (2013.01); *H05K 1/0245* (2013.01)

(58) Field of Classification Search
  USPC ........................................................ 174/250
  See application file for complete search history.

(56) References Cited

U.S. PATENT DOCUMENTS

| | | | |
|---|---|---|---|
| 2002/0084876 A1 | 7/2002 | Wright et al. | |
| 2004/0000959 A1 | 1/2004 | Howard et al. | |
| 2007/0063782 A1 | 3/2007 | Kanno et al. | |
| 2009/0255720 A1* | 10/2009 | Lu | H05K 1/0253 174/262 |
| 2010/0052820 A1 | 3/2010 | Wu et al. | |
| 2010/0109816 A1* | 5/2010 | Tzuang | H01P 3/082 333/238 |
| 2011/0273245 A1* | 11/2011 | Pai | H01P 3/003 333/204 |
| 2013/0271909 A1 | 10/2013 | Chen et al. | |
| 2016/0087323 A1 | 3/2016 | Wu et al. | |
| 2017/0318665 A1* | 11/2017 | Bois | H05K 1/0245 |

OTHER PUBLICATIONS

JP Office Action for Application No. 2018-093908, dated Feb. 19, 2019, w/ First Office Action Summary.

Gao, Xian-Ke et al., A Compact Common-Mode Noise Suppression Filter for High Speed Differential Signals Using Defected Groung Structure, Asia-Pacific Symposium on Electromagnetic Compatibility (APEMC) 2015, pp. 685-688.

TW Office Action for Application No. 107112816, dated Apr. 15, 2019, w/First Office Action Summary.

TW Search Report for Application No. 107112816, dated Apr. 15, 2019, w/First Office Action.

* cited by examiner

HIGH SPEED DIFFERENTIAL TRACE WITH REDUCED RADIATION IN RETURN PATH

PRIORITY CLAIM

This application claims priority to U.S. Provisional Application No. 62/590,417, filed on Nov. 24, 2017. The contents of that application are hereby incorporated by reference in their entirety.

TECHNICAL FIELD

The present disclosure relates generally to high speed differential traces. More particularly, aspects of this disclosure relate to a high speed differential trace having a return path to reduce interference radiation.

BACKGROUND

High speed differential signal traces are widely used in server/storage product designs. Many server/storage products include a chassis that mounts different printed circuit boards for electronic devices. The printed circuit boards include various signal traces to provide signals to the devices on the boards. Signal traces generally are arranged in differential trace pairs for a particular signal line. Such differential traces on a printed circuit board have different modes; including differential mode, common mode, and mode conversion between differential signals during transmission. Since more and more product applications include differential signal transition between different boards or between boards and cables, common mode energy will radiate through connectors over these transitions to holes in a chassis. Common mode energy results in a signal on both differential traces. Common mode energy can therefore generate noise that interrupts the transmission of signals over the traces and create interference problems.

FIG. 1 is an example of a prior art return current circuit trace 10 on a printed circuit board 12. The printed circuit board 12 is attached to a ground plane layer 14. The current circuit trace 10 includes two differential traces 22 and 24 on one surface 20 of the printed circuit board 12. The ground plane layer 14 contacts the opposite surface of the printed circuit board 12. An arrow 30 shows the insertion current in the differential trace 22. An arrow 32 shows an induction current in the differential trace 24. An arrow 34 shows a return current that is generated in the ground plane layer 14 under the differential trace 22. As shown in FIG. 1 common mode energy is generated by the insertion current represented by the arrow 30 minus coupling terms.

FIG. 2 is a graph of electronic signal interference from signals in a server chassis. The server chassis includes boards with differential traces similar to that shown in FIG. 1. The server chassis has several boards. The transition between the different boards allows common mode energy to radiate through holes in the chassis. A line 50 is the allowed noise for a trace in an FCC Class A digital device while a line 60 is the allowed noise for a system in an FCC Class A-AV device. As may be seen, the allowed noise level is lower for the more modern Class A-AV devices. A spike 80 represents unacceptable noise radiation at approximately 8 GHz frequency generated from an example system such as a server chassis.

To reduce radiation caused by common mode energy, there is a need for trace design that reduces common mode energy, while maintaining total energy for differential signals. There is a further need for a differential trace that allows different shapes of a return path to reduce common mode energy. There is also a need for determining the length of a return path that causes interference to cancel noise at a specific frequency.

SUMMARY

One disclosed example is a high speed circuit. The high speed circuit has a printed circuit board having a first surface and an opposite second surface. A ground plane layer has a first surface in contact with the second surface of the printed circuit board. A pair of first and second differential traces are formed on the first surface of the board structure. The differential traces carry an electrical signal. A first void section is formed on the first surface of the ground plane layer. The first void section is in proximity to the first differential trace. A second void section is formed on the first surface of the ground plane layer. The second void section is in proximity to the second differential trace. A third void section is formed on the first surface of the ground plane layer. The third void section joins the first and second void section.

Another disclosed example is a method of producing a low interference differential trace. First and second differential traces are formed on a first surface of a printed circuit board. A first void section is formed in a ground plane layer joined to a second surface of the printed circuit board. The first void section is formed in proximity to the first differential trace. The second surface of the printed circuit board is opposite the first surface. The length of a second void section is determined based on a target radiation frequency. The second void section is formed having the determined length on the ground plane layer. The second void section is formed in proximity to the second differential trace. A third void section is formed on the first surface of the ground plane layer. The third void section joins the first and second void section.

Another disclosed example is a high speed differential trace structure that reduces common mode radiation. The differential trace structure includes a first trace and a parallel second trace. A printed circuit board layer has a top surface and an opposite bottom surface. The first and second traces are formed on the top surface. The structure includes a ground plane layer having a top layer in contact with the opposite bottom surface of the printed circuit board. A first void section is formed in the top layer of the ground plane layer to one side of the first trace. A second void section is formed in the top layer of the ground plane layer to one side of the second trace. The length of the second void section is determined based on a target radiation frequency. A third void section is formed on the first surface of the ground plane layer. The third void section joins the first and second void section.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

DETAILED DESCRIPTION OF THE ILLUSTRATED EMBODIMENTS

Figure 1:
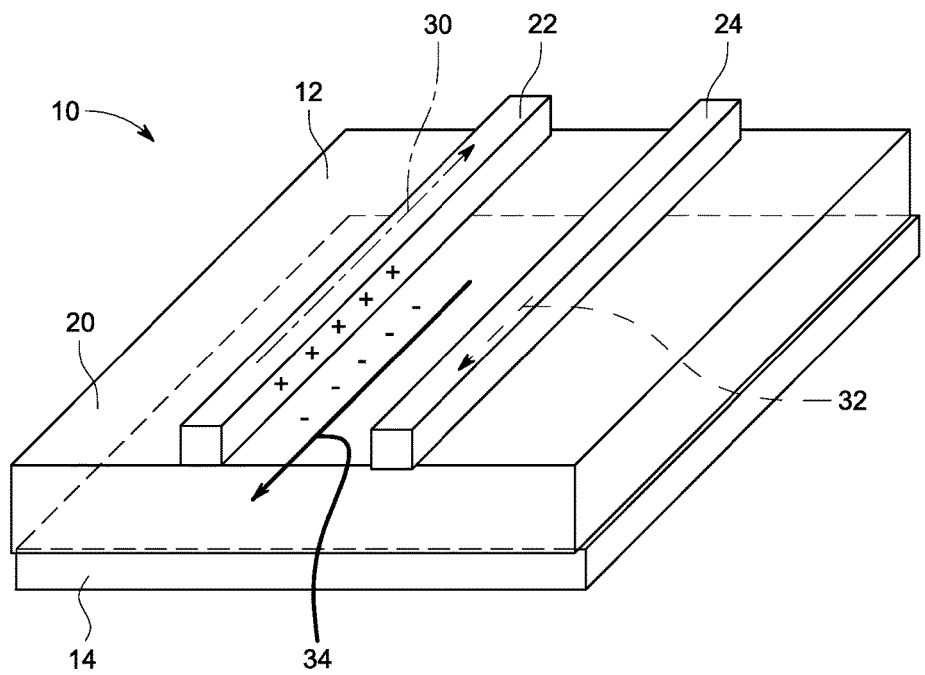
FIG. 1 is an example of a prior art differential trace on a printed circuit board.

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 3:
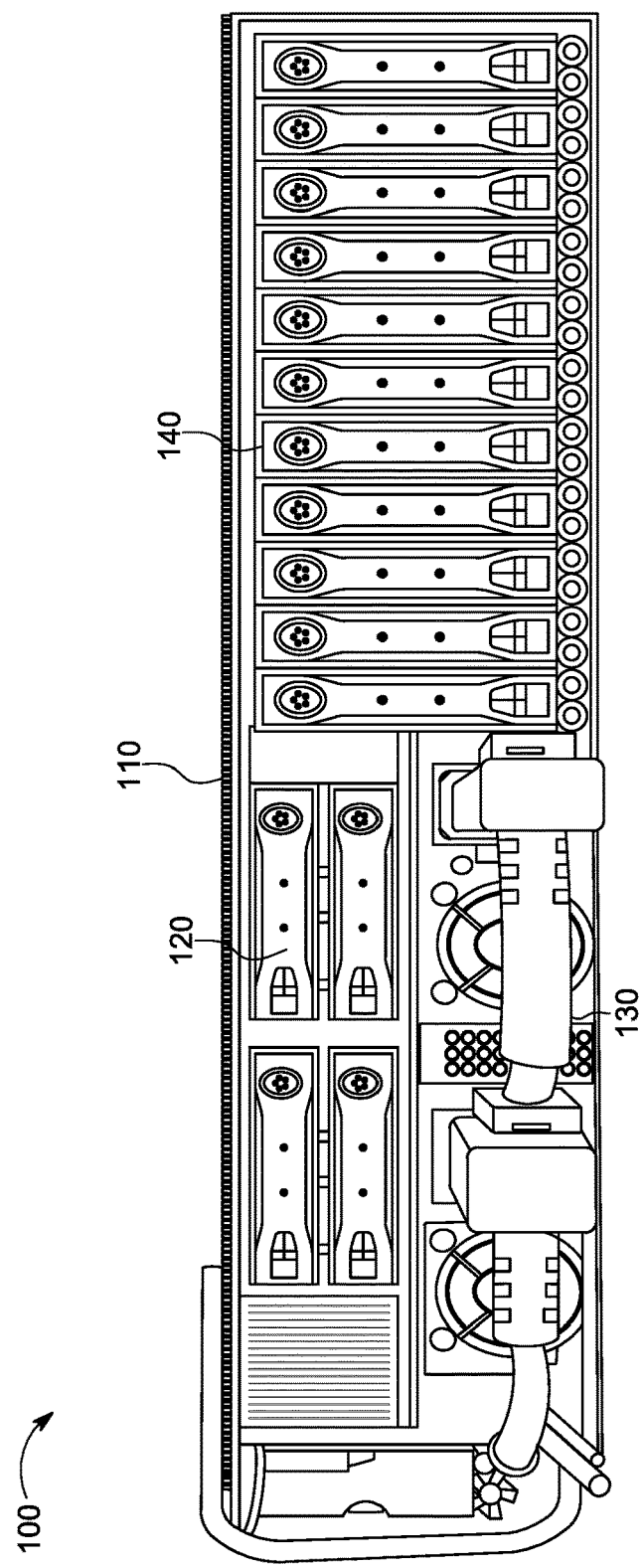
FIG. 3 is a back view of an electronic device including multiple circuit boards including traces having the example reduced interference return paths.

FIG. 3 shows an example electronic device 100. The electronic device 100 is a server that includes a number of different components contained in a chassis 110. For example, one group of components 120 is mounted on one side of the chassis 110 above two power supply units 130. Another group of components 140 is mounted in vertical slots in the chassis 110. Each of the components in the groups of components 120 and 140 include printed circuit boards. The printed circuit boards include differential traces that connect the electronic components on the boards and conduct signals between the components. The chassis 110 has a number of holes through which noise generated from the circuit boards of the components 120 and 140 may be emitted.

Figure 2:
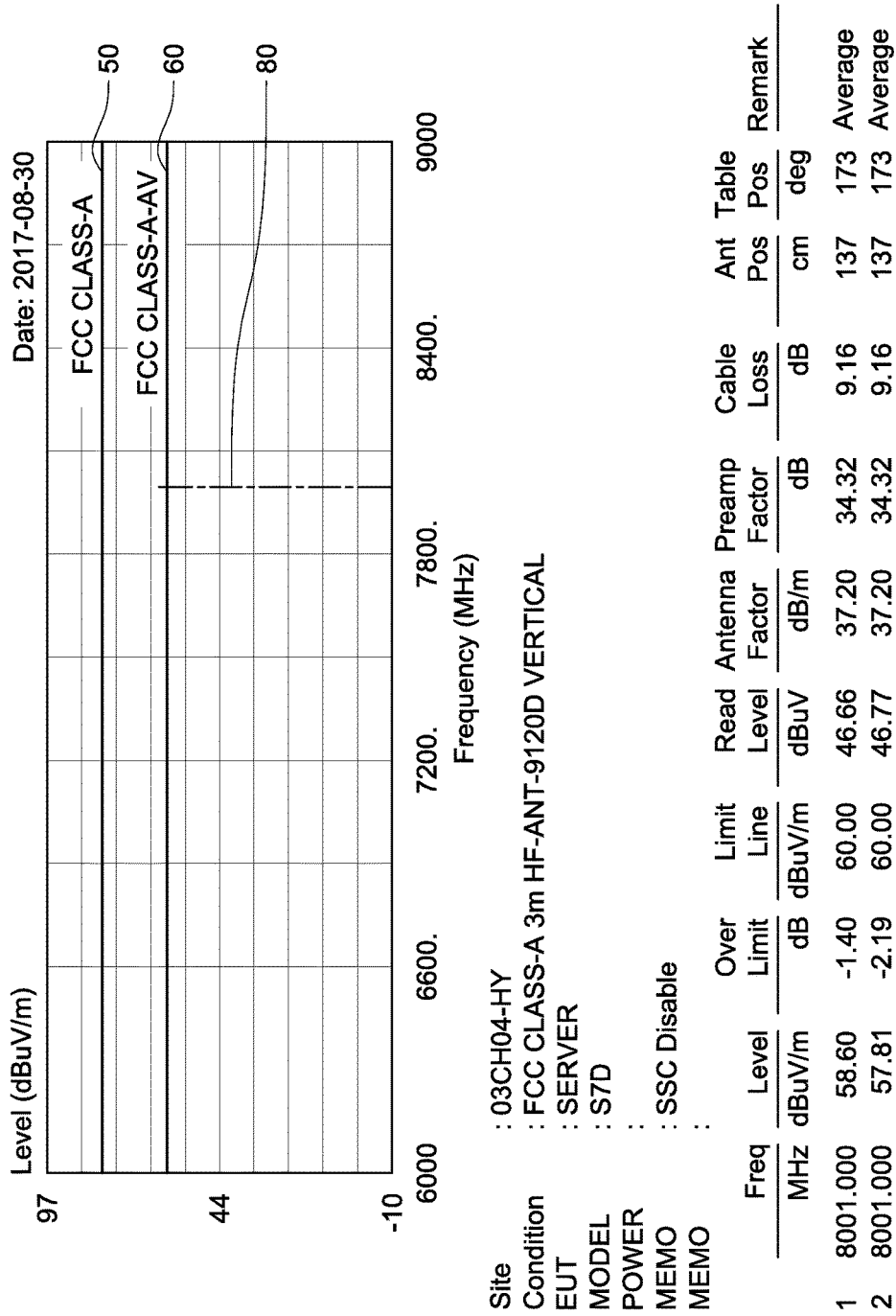
FIG. 2 is a graph of electronic signal interference at a specific frequency from signals from prior art differential traces in a chassis.

FIG. 2 is a graph that shows output noise through the holes in the chassis 110 with known differential trace circuits. As shown in FIG. 2, the output noise occurs at approximately 8 GHz in this example. The output noise is generated due to common mode energy from the differential traces on the circuit boards in the chassis.

In order to decrease this interference, each of the boards of the components 120 and 140 (in FIG. 3) includes differential traces that incorporate a return path design in the ground plane layer that reduces common mode energy at the target frequency of 8 GHz. The incorporation of such traces thereby decreases the electronic noise generated by the electronic device 100. The target frequencies are determined by interference testing of the chassis 110. The target frequency depends on the trace data rate transmitted on the boards in the chassis 110.

The process of designing a return trace to reduce common mode energy relies on the fact a differential trace circuit may be modeled using a four port s-parameter. For a four port (2 signal trace) s-parameter, there are insertion terms $S_{31}$ and $S_{42}$ and induction terms $S_{41}$ and $S_{32}$. The induction terms have an opposite direction to the insertion terms based on Lenz's Law. Based on a mixed mode s-parameter formula, the differential mode output ($S_{dd21}$) of the differential signals is:

$$S_{dd21}=(S_{31}-S_{32}+S_{42}-S_{41})/2$$

The common mode output ($S_{cc21}$) of the differential signals is:

$$S_{cc21}=(S_{31}+S_{32}+S_{42}+S_{41})/2$$

In order to reduce common mode output energy, an increase in the coupling terms is desired. As shown in FIG. 1, there will be a return current for a differential signal, represented by the arrow 34, in the ground plane 14 just underneath the trace 22. The return current represented by the arrow 34 flows in the opposite direction of the current represented by arrow 30 in the trace 22. Thus, a return current path may be designed that results in destructive interference at a target frequency. In this situation, a nearby trace, such as the trace 24, will be the new path for the return current. This new return current path increases the coupling terms. Hence, the common mode will be greatly reduced. The formula for the length of the new return current path is:

$$L_{path}=1/(2f*TD)$$

In this equation, $L_{path}$ is the length of the new path. TD is the time delay per mil length for the differential signal propagating in the trace, and f is the target radiation frequency.

Figure 4:
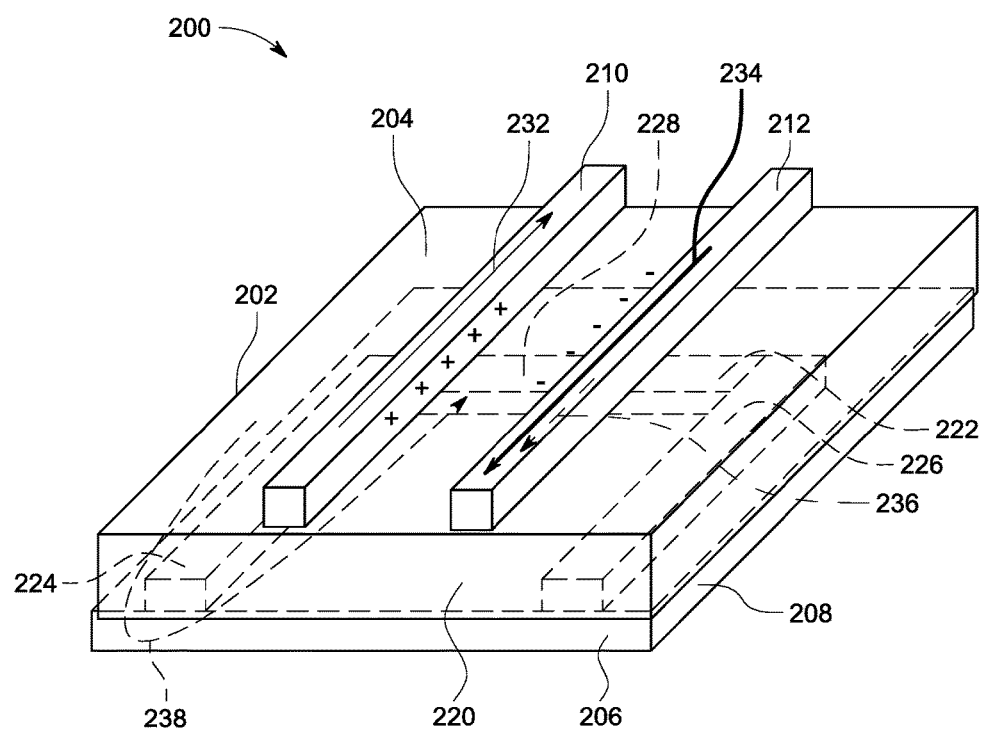
FIG. 4 is a perspective view of an example differential trace having a return path to reduce common mode energy.
Figure 5:
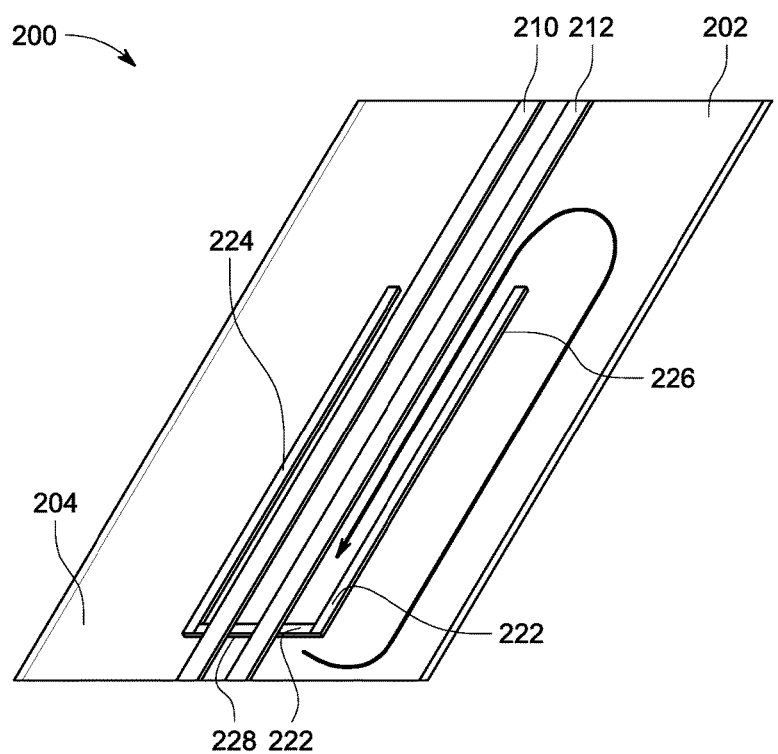
FIG. 5 is a perspective top view of the example differential trace in FIG. 4.
Figure 6:
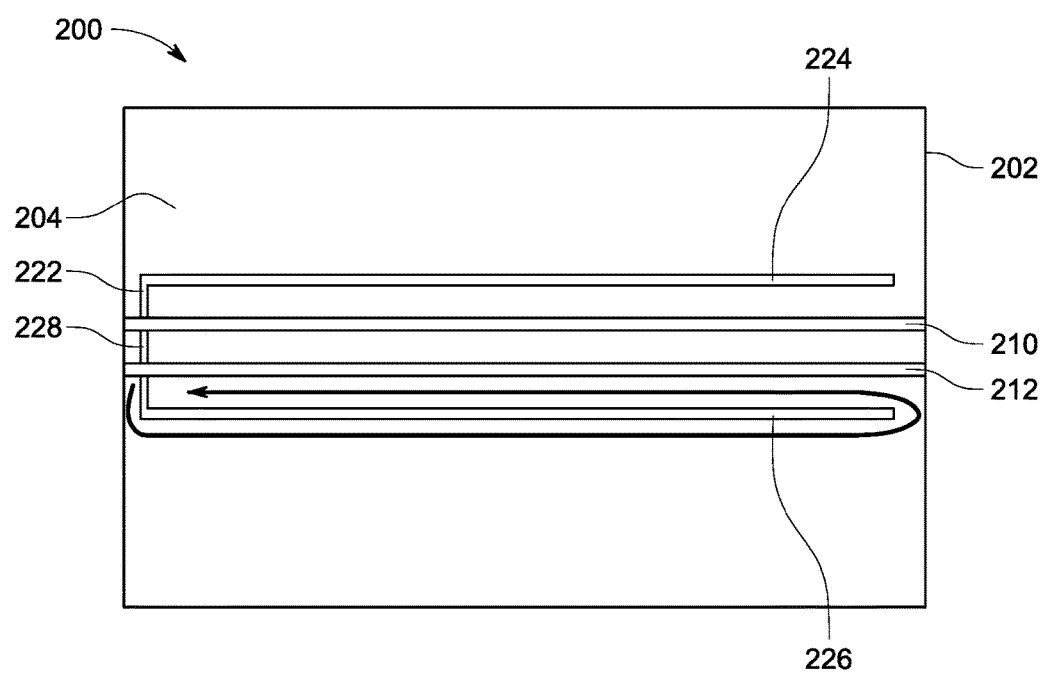
FIG. 6 is a top-down view of the example differential trace in FIG. 4.

FIG. 4 is a perspective view of an example trace configuration 200 that is designed from the above criteria. FIG. 5 shows a perspective top view of the example differential trace design in FIG. 4. FIG. 6 is a top-down view of the example trace design in FIG. 4. Like elements are labeled with like numerals in FIGS. 4-6. The trace design 200 in FIGS. 4-6 is formed on a printed circuit board 202. The printed circuit board 202 has a first surface 204, and an opposite second surface 206. The second surface 206 is in contact with a ground plane layer 208. Two parallel traces 210 and 212 are formed on the first surface 204 of the printed circuit board 202. The ground plane layer 208 has a first surface 220 that is in contact with the second surface 206 of the circuit board 202. A U-shaped, current return path pattern 222 is created in the first surface 220 of the ground plane layer 208. The U-shaped pattern 222 includes a first void section 224 that is located to the side of the trace 210 in this example. The void section 224 in this example is approximately parallel to the trace 210. The U-shaped pattern 222 also includes a void section 226 that is located to the side of the trace 212 in this example. The void section 226 is approximately parallel to the trace 212 in this example. A void section 228 joins the void sections 224 and 226. The void sections 224 and 226 thus are located in the ground plane layer 208 outside of the respective traces 210 and 212.

As may be seen in FIG. 4, an arrow 232 represents the insertion current in the trace 210. An arrow 234 represents the induction current that flows through the trace 212. The U-shaped pattern 222 causes destructive interference of any return current in the ground plane layer 208 at the desired frequency. Thus, an arrow 236 shows the return current has been shifted to the parallel trace 212. In so doing, destructive interference from the direction of the induction current 212 cancel the current generated from the opposite direction of the insertion current 232. A dashed line 238 represents the return current that is eliminated based on the destructive interference from the void sections 224, 226 and 228 of the U-shaped pattern 222.

In this example, it is desired to avoid a target radiation frequency of 8 GHz. The length of the void section 226 constitutes the new current return path as determined by the above formula. In this example, given the target radiation frequency is 8 GHz and the time delay (TD) per mil is 1.4285*10−13, the length of the return path, $L_{path}$, is determined to be 437.5 mil. Comparing the common mode output, $S_{cc21}$, resulting from the U-shaped pattern 222, and the common mode output from a conventional differential trace without the U-shaped pattern 222, there is deep drop close to 8 GHz which meets the design target.

Figure 7:
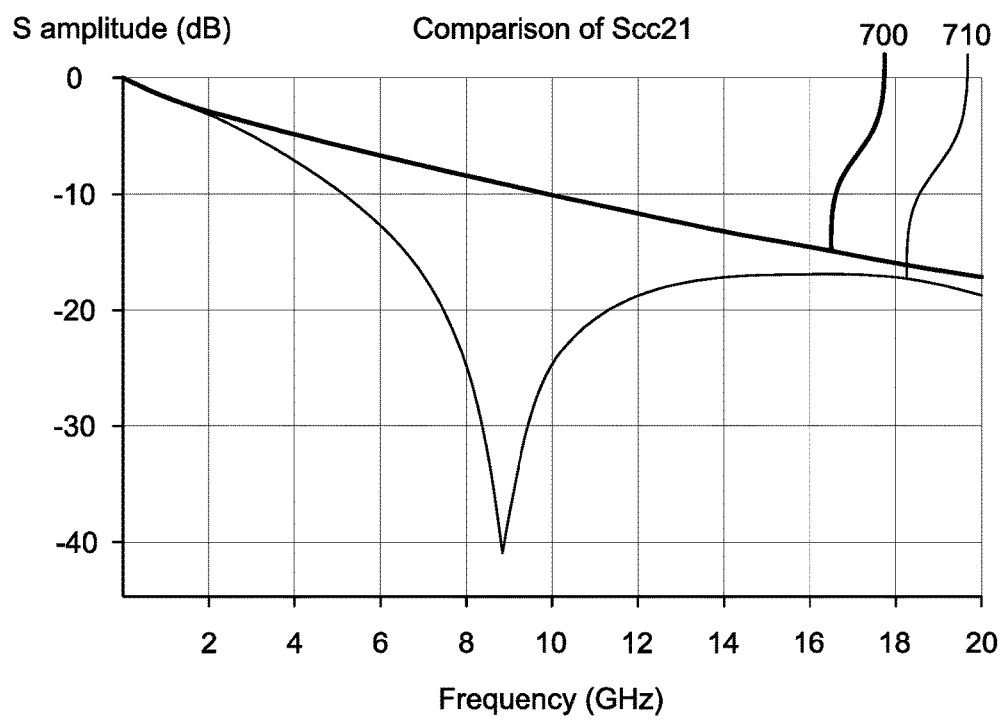
FIG. 7 is a graph of the return current characteristics of the example differential trace in FIG. 4 at the target frequency.

FIG. 7 is a graph of the noise level generated from the trace circuit 200 compared with that of a trace circuit without the U-shaped pattern 222 in FIG. 4. A first line 700 represents a differential trace that does not include the voids of the U-shaped pattern 222. A second line 710 represents the drop in return current based on the new return current path in the void section 226 in FIG. 4. As may be seen in FIG. 7, the drop in return current occurs at approximately 8 GHz, which results in additional coupling and then reducing the common node noise at the target frequency.

The differential trace circuit 200 in FIGS. 4-6 may be specifically produced to address radiation at a certain frequency. The differential traces 210 and 212 are formed on the surface 204 of the printed circuit board 202. The void section 224 is formed on the surface 220 of the ground plane layer 208. The length of the void section 226 is determined based on a target radiation frequency. As explained above, the length is determined based on the target radiation frequency and the time delay per mil length for the differential signal propagating in the traces 210 and 212. The void section 226 is formed with the determined length on the surface 220 of the ground plane layer 208. The void section 224 is formed on one side, in proximity, of the differential trace 210, and the void section 226 is formed on one side, in proximity, to the differential trace 212. The void section 228 is formed on the ground plane layer 208 to join the void section 224 and the void section 226. Once the void sections 224, 226, and 228 of the U-shaped pattern 222 are formed in the ground plane layer 208, the ground plane layer 208 is joined to the surface 206 of the printed circuit board 202.

Although the void sections 224, 226, and 228 in the example U-shaped pattern 222 are roughly straight line shapes, the reduction in common mode interference may be accomplished by any shape or pattern of voids in the ground plane 208, as long as the void section for the new return current has a length determined from the desired target radiation frequency. Further, the void sections for a return current pattern in the ground plane 208 need only include one void section on one side from the differential trace 210; a second void section in on the opposite side from the differential trace 212; and a third void section connecting the first two void sections. Although the above examples, show the third void section being perpendicular to the first and second void sections, any angle may be selected for the third void section relative to the first and second void sections. The shapes of the void sections such as the void sections 224 and 226 do not have to be identical. Thus, the shape of the void section 224 may be one shape, while the void section 226 may have another shape, as long as the void section 226 has the sufficient length determined from the target frequency.

Figure 8:
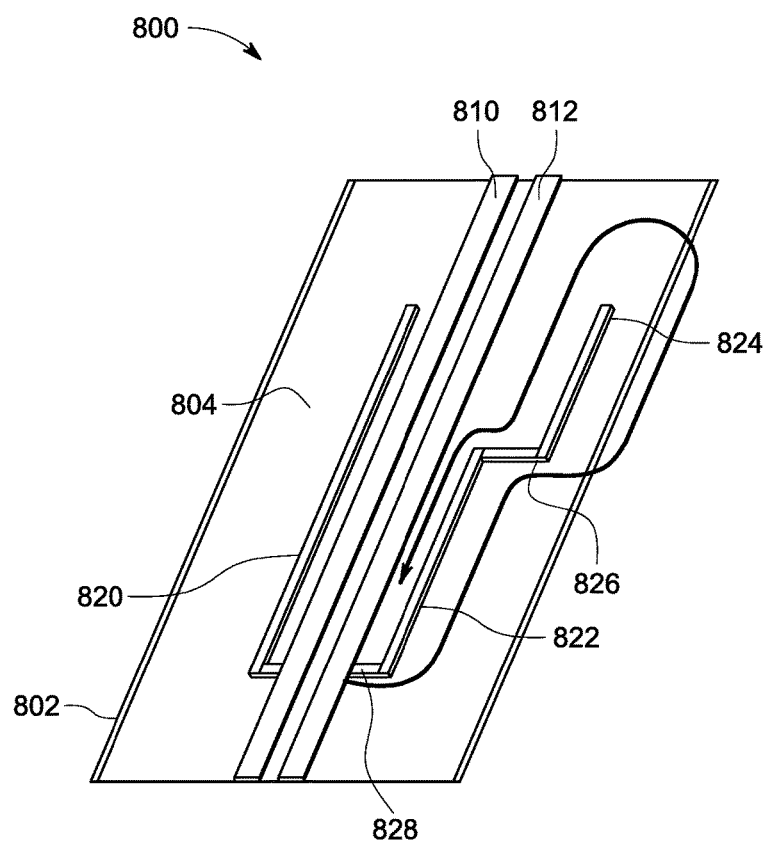
FIG. 8 is a perspective top view of another example differential trace having a different shaped return path.

FIG. 8 is a perspective view of another example trace circuit 800 with a different shaped return path than that of the U-shaped pattern 222 in FIG. 7. The trace design 800 in FIG. 8 is formed on a printed circuit board 802. The printed circuit board 802 has a top surface 804 and an opposite bottom surface. The bottom surface is in contact with a ground plane layer underlying the printed circuit board 802. Two parallel traces 810 and 812 are formed on the top surface 204. A series of void sections is created on the surface of the ground plane layer in contact with the bottom surface of the printed circuit board 802. The void sections include a continuous segment 820 that is located to one side of the trace 810. The void sections also include two segments 822 and 824 that are parallel to the trace 812. Both of the two segments 822 and 824 are located to a side of the trace 812. One of the segments 822 is located proximally to the side of the trace 812. The other segment 824 is offset from the trace 812 and located distally to the side of the trace 812. The segments 822 and 824 are joined together by a cross segment 826 to create a ladder shape. A void section 828 joins the segments 820, 824, and 826. As may be seen in FIG. 8, the shapes and relative locations for the segments 822 and 824 in relation to the trace 812 differ from those of the segment 820 in relation to the trace 810.

The overall length of the two segments 822 and 824, combined, is determined by the above formula to cancel a target radiation frequency. In this example, given the target radiation frequency is 8 GHz and the time delay (TD) per mil is 1.4285*10−13, the length of the return path, $L_{path}$, is determined to be 437.5 mil. Thus, the total length of the two segments 822 and 824 in FIG. 8 is 437 mil.

Similar to the differential trace circuit 200 in FIG. 2, an insertion current is generated in the trace 810. An induction current flows through the trace 812. The void section of the segments 822 and 824 causes destructive interference of any return current in the ground plane layer at the desired target frequency. Thus, the return current is shifted to the parallel trace 812. As explained above, the shape and distance to the trace 810 of the segment 820 may vary and be similar or different from those of the segments 822 and 824. Different patterns and locations for the segments 822 and 824 other than the ladder configuration may be used.

Figure 9:
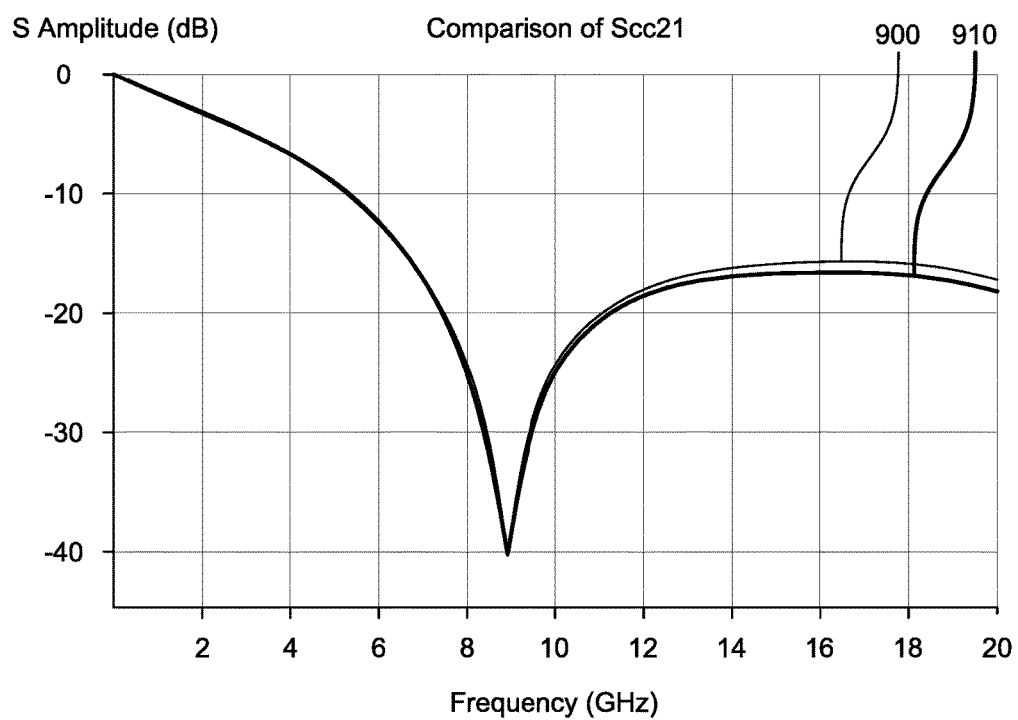
FIG. 9 is a perspective top view of another example differential trace having a different shaped return path; and The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

FIG. 9 is a graph of the noise level generated from the trace circuit 200. A first line 900 represents the return current from the differential trace circuit 200 in FIG. 4. A second line 910 represents the return current from the differential trace circuit 800 in FIG. 8. As may be seen, the configuration of the return path in FIG. 8 results in roughly the same drop in return current as that of the return path in FIG. 2. Thus, the alternate differential trace configuration 800 in FIG. 8 is effective in canceling noise at the target frequency of 8 GHz.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A high speed circuit, comprising:
   a printed circuit board having a first surface and an opposite second surface;
   a ground plane layer having a first surface in contact with the second surface of the printed circuit board;
   a pair of first and second differential traces on the first surface of the board structure, the differential traces carrying an electrical signal;
   a first void section on the first surface of the ground plane layer, the first void section on one side of the first differential trace;
   a second void section on the first surface of the ground plane layer, the second void section on one side of the second differential trace, wherein the second void section includes a first segment and a second segment, wherein the first and second segments are parallel to the second differential trace, wherein the second segment is offset from the first segment; and
   a third void section on the first surface of the ground plane layer, the third void section joining the first and second void section,
   wherein a distance between the first void section and the first differential trace and a distance between the second void section, and the second differential trace are different.

2. The high speed circuit of claim 1, wherein the first and second void sections have identical shapes.

3. The high speed circuit board of claim 1, wherein the length of the second void section is determined by:

$$L\text{path}=1/(2f*TD)$$

wherein, Lpath is the length of second void section, TD is the time delay per mil length for a differential signal propagating in the differential traces, and f is the target radiation frequency.

4. A high speed circuit, comprising:
   a printed circuit board having a first surface and an opposite second surface;
   a ground plane layer having a first surface in contact with the second surface of the printed circuit board;
   a pair of first and second differential traces on the first surface of the board structure, the differential traces carrying an electrical signal;
   a first void section on the first surface of the ground plane layer, the first void section on one side of the first differential trace;
   a second void section on the first surface of the ground plane layer, the second void section on one side of the second differential trace; and
   a third void section on the first surface of the ground plane layer, the third void section joining the first and second void section,
     wherein the length of the second void section depends on canceling noise at a target radiation frequency, wherein the target radiation frequency is 8 Ghz.

5. A method of producing a low interference differential trace, the method comprising:
   forming first and second differential traces on a first surface of a printed circuit board;
   forming a first void section in a ground plane layer joined to a second surface of the printed circuit board, the second surface opposite the first surface, wherein the first void section is formed to one side of the first differential trace;
   determining a length of a second void section based on a target radiation frequency;
   forming a second void section having the determined length on the ground plane layer, the second void section being formed to one side of the second differential trace, wherein the second void section includes a first segment and a second segment, wherein the first and second segments are parallel to the second differential trace, wherein the second segment is offset from the first segment; and forming a third void section on the ground plane layer, the third void section joining the first and second void sections,
wherein a distance between the first void section and the first differential trace, and a distance between the second void section and the second differential trace, are different.

6. The method of claim 5, wherein the first and second void sections have identical shapes.

7. The method of claim 5, wherein the length of the second void section is determined by:

$$L\text{path}=1/(2f*TD)$$

wherein, Lpath is the length of second void section, TD is the time delay per mil length for a differential signal propagating in the differential traces, and f is the target radiation frequency.

8. A high speed differential trace structure comprising:
a first trace;
a parallel second trace;
a printed circuit board layer having a top surface and an opposite bottom surface, wherein the first and second traces formed on the top surface;
a ground plane layer having a top layer in contact with the opposite bottom surface of the printed circuit board;
a first void section formed in the top layer of the ground plane layer on one side of the first trace;
a second void section having a determined length formed in the top layer of the ground plane layer on one side of the second trace, wherein the length of the second void section is determined based on a target radiation frequency, and wherein the second void section includes a first segment, and a second segment offset from the first segment; and
a third void section on the first surface of the ground plane layer, the third void section joining the first and second void section,
wherein the length of the second void section is determined by:

$$L\text{path}=1/(2f*TD)$$

wherein, Lpath is the length of second void section, TD is the time delay per mil length for a differential signal propagating in the differential traces, and f is the target radiation frequency.

9. A method of producing a low interference differential trace, the method comprising:

forming first and second differential traces on a first surface of a printed circuit board;
forming a first void section in a ground plane layer joined to a second surface of the printed circuit board, the second surface opposite the first surface, wherein the first void section is formed to one side of the first differential trace;
determining a length of a second void section based on a target radiation frequency;
forming a second void section having the determined length on the ground plane layer, the second void section being formed to one side of the second differential trace, wherein the length of the second void section depends on canceling noise at an 8 Ghz target frequency; and
forming a third void section on the ground plane layer, the third void section joining the first and second void sections.

10. A high speed circuit, comprising:
a printed circuit board having a first surface and an opposite second surface;
a ground plane layer having a first surface in contact with the second surface of the printed circuit board;
a pair of first and second differential traces on the first surface of the board structure, the differential traces carrying an electrical signal;
a first void section on the first surface of the ground plane layer, the first void section on one side of the first differential trace;
a second void section on the first surface of the ground plane layer, the second void section on one side of the second differential trace, wherein the second void section includes a first segment and a second segment, wherein the first and second segments are parallel to the second differential trace, wherein the second segment is offset from the first segment; and
a third void section on the first surface of the ground plane layer, the third void section joining the first and second void section, wherein the length of the second void section is determined by:

$$L\text{path}=1/(2f*TD)$$

wherein, Lpath is the length of second void section, TD is the time delay per mil length for a differential signal propagating in the differential traces, and f is the target radiation frequency.

* * * * *